March 19, 1968 J. A. OLMSTEAD 3,374,407
FIELD-EFFECT TRANSISTOR WITH GATE-INSULATOR VARIATIONS
TO ACHIEVE REMOTE CUTOFF CHARACTERISTIC
Filed June 1, 1964 2 Sheets-Sheet 1

INVENTOR.
JOHN A. OLMSTEAD
BY
W. S. Hill
AGENT

INVENTOR.
JOHN A. OLMSTEAD
BY
W. S. Hill
AGENT

United States Patent Office 3,374,407

Patented Mar. 19, 1968

3,374,407

FIELD-EFFECT TRANSISTOR WITH GATE-INSULATOR VARIATIONS TO ACHIEVE REMOTE CUTOFF CHARACTERISTIC

John A. Olmstead, Branchburg Township, Somerset County, N.J., assignor to Radio Corporation of America, a corporation of Delaware Filed June 1, 1964, Ser. No. 371,674

11 Claims. (Cl. 317—235)

ABSTRACT OF THE DISCLOSURE

An insulated-gate field-effect transistor has a gate insulator which provides differing pinch-off voltages laterally along the gate. The transistor exhibits a remote cutoff gain characteristic.

Figures 1, 2, 3, 4, 5, 6, 7:
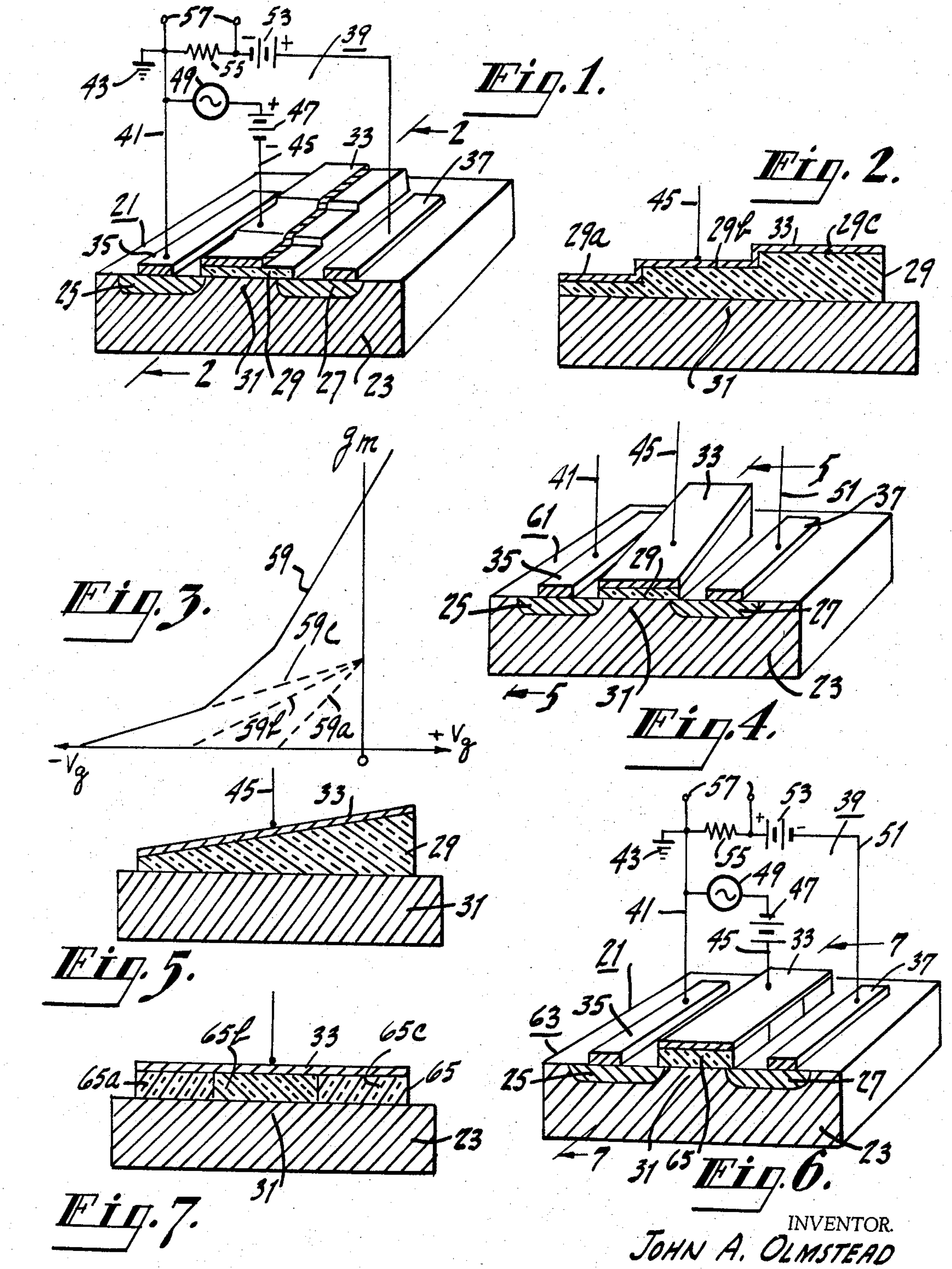

This invention relates to insulated-gate field-effect transistors.

Previous insulated-gate field-effect transistors comprise generally a channel, a source and a drain connected to the channel and defining the ends of a drain current path through the channel, and a gate overlying and closely spaced from the channel by a thin insulator layer. Such devices are used as active elements in electronic circuits; for example, in amplifying, switching, or oscillating circuits.

An important characteristic of this device is its gain characteristic which is a plot of the transconductance $g_m$ as a function of the gate voltage $V_G$. The transconductance $g_m$ is defined as the ratio of the differential change of drain current $\partial I_D$ through the channel (between source and drain) to the differential change of gate voltage $\partial V_G$ at constant drain voltage $V_D$. The pinch off voltage $V_{po}$ of the device is the gate voltage at which the drain current approaches zero.

Previous insulated-gate field-effect transistors exhibit a gain characteristic with a sharp cutoff. By sharp cutoff is meant that the transconductance drops sharply as the gate voltage changes in the proper sense to reduce the drain current. A gain characteristic with a sharp cutoff is desirable in some applications; for example, in switching circuits. However, in other applications, for example, in automatic gain controlled amplifying circuits, a more desirable gain characteristic is one having a remote cutoff. By remote cutoff is meant that there are progressively smaller reductions in transconductance (and drain current) for regular changes in gate voltage which drive the device to conduct smaller drain currents. Ideally, a gain characteristic having a remote cutoff is asymptotic with the value $g_m=0$ and the gate voltage never completely pinches off the drain current. But, in practice, this is only approximated. As used herein, therefore, a gain characteristic having a remote cutoff may either be asymptotic or approximately asymptotic with the value $g_m=0$.

An object of this invention is to provide a novel insulated-gate field-effect transistor.

Another object is to provide an insulated-gate field-effect transistor having a remote cutoff characteristic.

A further object is to provide an insulated-gate field-effect transistor which is particularly useful in gain controlled amplifying circuits.

In general, the insulated-gate field-effect transistor of the invention comprises a source and a drain defining the ends of a plurality of drain current paths of controllable conductivity and a gate spaced from the current paths by an insulator. The transistor has a remote cutoff gain characteristic preferably by having differing pinch off voltages laterally along the gate for the plurality of drain current paths. The lateral direction, or laterally, as used herein, is the direction transverse to the drain current paths and along the gate. Because the transistor has a plurality of drain current paths with differing predetermined pinch off voltages along the gate transversely to the path, the gain characteristic of the device has a remote cutoff.

The gain characteristic may be shaped by physical variations in one or more structures of the device laterally across the channel and preferably under the gate. The thickness of the insulator which spaces the gate and the channel may vary laterally (instead of having a uniform thickness). The effect of the gate voltage is to produce in the novel structure an electric field in the channel which varies in the lateral direction, so that the current paths pinch off at different values of gate voltage.

Figure 8:
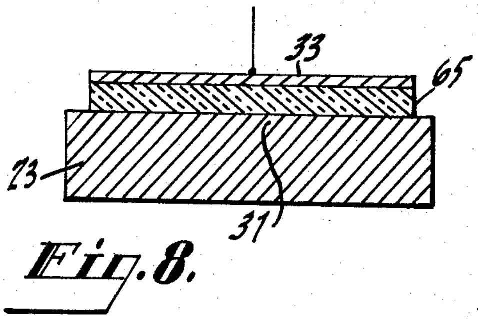
Figure 9:
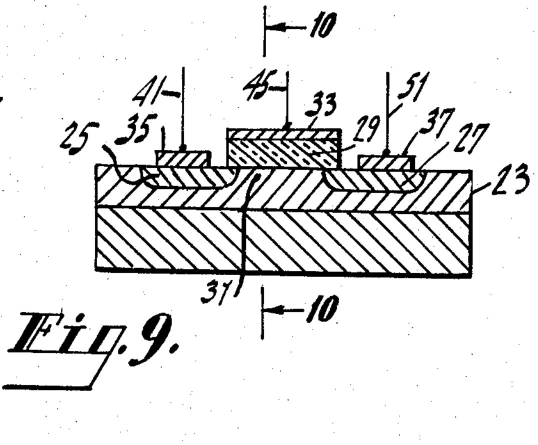
Figures 10, 11, 13:
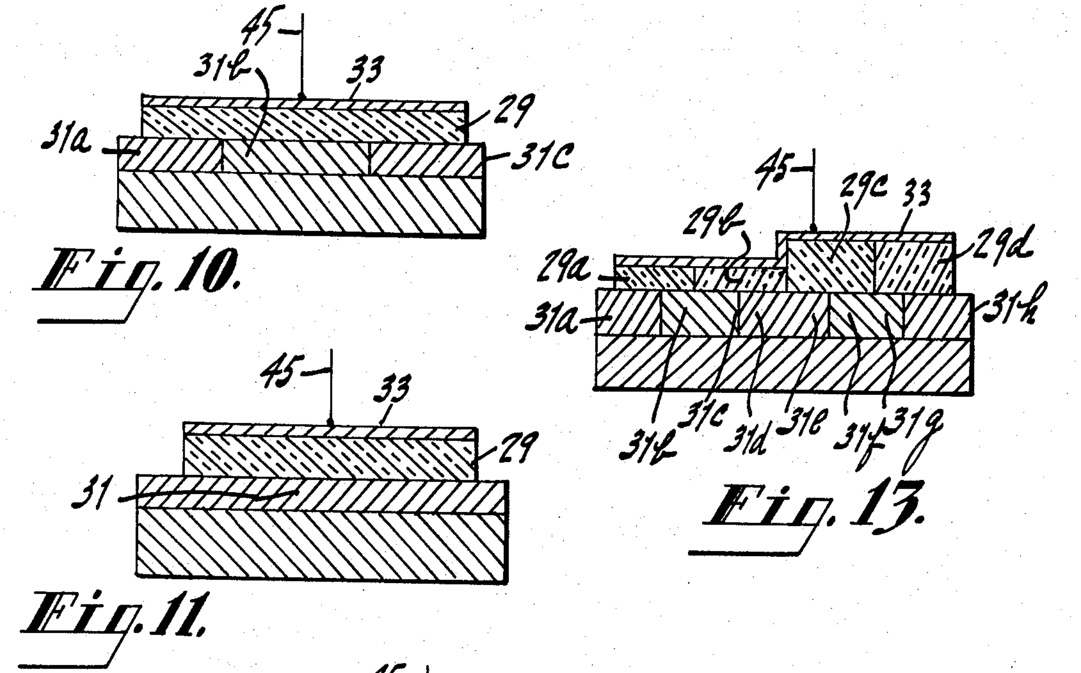
Figure 12:
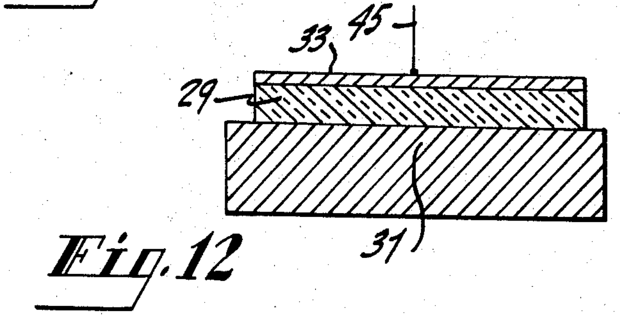

A more detailed description of the invention and illustrative embodiments thereof appear below in conjunction with the drawings in which:

FIGURES 1 and 2 are respectively perspective and sectional views of a first embodiment of the invention having an insulator which is stepped laterally;

FIGURE 3 is a curve illustrating a typical gain characteristic of the embodiment of FIGURE 1, FIGURES 4 and 5 are respectively perspective and sectional views of a second embodiment of the invention having an insulator with a laterally tapered thickness, FIGURES 6 and 7 are respectively perspective and sectional views of a third embodiment having an insulator with a laterally stepped dielectric constant, FIGURE 8 is a sectional view through the channel of a fourth embodiment having an insulator with a laterally tapered dielectric constant, FIGURES 9 and 10 are sectional views of a fifth embodiment having a channel with a laterally stepped dielectric constant, FIGURE 11 is a sectional view through the channel of a sixth embodiment having a channel with a laterally tapered dielectric constant, FIGURE 12 is a sectional view through the channel of a seventh embodiment having a channel whose conductivity is tapered laterally, and FIGURE 13 is a sectional view through the channel of an eighth embodiment illustrating that several lateral variations in structure may be used in combination.

Similar reference numerals are used for similar structures throughout the drawings.

Previous insulated-gate field effect transistors, which are described briefly above, are substantially uniform in structure in the lateral direction, i.e., transversely and along the gate and, as a result, exhibit a gain characteristic with a sharp cutoff. Consequently, the prior art considers the drain current to flow in a single path; or to flow in a plurality of parallel paths all of which have substantially the same pinch off voltage. The invention, however, provides a unitary structure in which the drain current flows in a plurality of paths which have different pinch off voltages. Thus, in some respects, the structure behaves as several field effect transistors, or sometimes as a continuous spectrum of field effect transistors, with different pinch off voltages all connected in parallel; that is, with their sources connected together and their drains connected together, and in the embodiments herein described, with the gates connected together.

The invention will be described for devices having an N-type channel. However, devices having a P-type channel are also part of the invention. Generally, the same analysis and circuits apply to devices having a P-type channel, except that all polarities are reversed.

FIGURES 1 and 2 illustrate a first embodiment 21 of the invention having an insulator with a stepped thickness in the lateral direction. The device 21 comprises a semiconductor body 23 of resistive P-type silicon, and a source 25 and a drain 27 of conducting N-type silicon in spaced locations in the body 23. An insulator 29 overlies the region of the body 23 between the source 25 and the drain 27, which region is referred to as the channel 31. The channel 31 is considered to be N-type because the drain currents are electron currents. The channel may have an excess of electrons with no gate voltage applied, or the excess of electrons may be induced in the channel by applying a positive gate voltage. The insulator 29 is preferably of silicon oxide although other insulators may be used.

The insulator 29 has three different thicknesses or steps 29*a*, 29*b* and 29*c*. The insulator 29 is thinnest (portion 29*a*) over one side of the channel 31 from source to drain 27, thickest (portion 29*c*) over the other side of the channel 31 from source 25 to drain 27, and of intermediate thickness (portion 29*b*) over the central portion of the channel 31 from source 25 to drain 27. A gate 33, preferably of metal, rests on the insulator 29 which spaces the gate 33 from the channel 31. The gate may extend over the entire surface of the insulator 29. It is preferred, as shown in FIGURE 1, that the gate 33 extend over only part of the insulator 29, from opposite the source 25 over about two-thirds of the distance toward the drain 27. A low resistance source electrode 35 of metal contacts the source 25 and a low resistance drain electrode 37 of metal contacts the drain 27.

The first embodiment 21 may be operated with a circuit 39 which comprises a source lead 41 connecting the source electrode 35 to ground 43, a gate section comprising a gate lead 45 connecting the gate electrode 33 to ground 43 through a gate bias source 47 and a signal source 49 connected in series, and a drain section comprising a drain lead 51 connecting the drain electrode 37 to ground 43 through a drain bias source 53 and a load resistor 55 connected in series. The output signal of the device may be monitored across the load resistor 55 at terminals 57 on each side of the load resistor 55. An amplified replica of a signal applied to the gate 33 from the signal source 49 appears across the terminals 57. The polarity of the biases shown in FIGURE 1 are for operating a device 21 having an N-type channel.

FIGURE 3 illustrates a gain curve 59 for the embodiment illustrated in FIGURE 1. The curve 59 is linear at the right hand portion of the curve 59 as viewed in FIGURE 3 and, at the left hand portion of the curve 59, exhibits a remote cutoff. Upon analysis, the curve 59 appears to be approximately the sum of the three curves 59*a*, 59*b* and 59*c*, which appear to approximate the gain curves of three devices of identical structure except for the three steps 29*a*, 29*b* and 29*c*, respectively of the insulator thickness, and having channels one-third the width of the channel of the first embodiment. Thus, by this analysis, the first embodiment has a single channel with effectively three drain current paths; each path having a different pinch off voltage and consequently a different gain characteristic. The additive effect of the three drain current paths is to provide a remote cutoff portion to the gain composite curve.

As shown in FIGURE 3, the component gain curves 59*a*, 59*b*, and 59*c* all intersect at $V_G=0$. This special case holds where the component paths are identical except for the respective insulator thicknesses. However, the component gain curves may have differing slopes and intersection point which result from physical differences in the component paths. The transconductance $g_m$ of each component path may be described qualitatively by the following relationship:

$$g_m = n_o e\mu\left(\frac{W\lambda}{L}\right)+\left(\frac{\epsilon_{ox}}{s}\right)\left(\frac{W}{L}\right)\mu V_G$$

where:

$n_o$ is the initial free carrier density in the channel
$e$ is a unit electronic charge
$\mu$ is the mobility of majority carriers in the channel
$\epsilon_{ox}$ is the dielectric constant of the insulator
$s$ is the thickness of the insulator
L is the length of the channel under the gate in the direction from source to drain
W is the width of the channel
$\lambda$ is the thickness of the channel It follows that different component gain curves can be provided with changes in one or more of the parameters that appear in only one of the two terms on the right side of the equation. It also follows that changes in any of the parameters that appear in only one of these two terms will impart a remote cutoff to the gain characteristic. Thus, the device may have lateral changes in thickness $s$, or dielectric constant $\epsilon_{ox}$ of the insulator, charge carrier density $n_o$, or thickness $\lambda$ of the channel.

Although not shown in the equation, lateral changes in the dielectric constant of the channel $\epsilon_{ch}$ will also produce the remote cutoff. In the usual case, where the insulator is much thicker than the channel, this effect is relatively small. However, a greater effect is produced when the insulator thickness $s$ is smaller relative to the channel thickness $\lambda$, or where the dielectric constant of the insulator $\epsilon_{ox}$ is much greater than the dielectric constants $\epsilon_{ch}$ of the channel.

The circuit 39 illustrated in FIGURE 1 is illustrative of circuits generally that are useful. Other circuits may be used to operate one or more embodiments of the invention. The circuit may be an amplifier of controllable gain in a radio frequency receiver including a transistor of the invention, means in the receiver for deriving an automatic gain control voltage as a function of received signal strength, and means for applying the derived control voltage to the gate of the transistor. As shown in FIGURE 1, the signal source 49 may provide a radio frequency signal, and the bias source 47 may provide an automatic gain control voltage. Generally, the sources 47 and 49 each may provide a signal D.C., low frequency A.C., or high frequency A.C. Thus, the device and circuit illustrated in FIGURE 1 may function as a mixer.

As shown in FIGURE 1, the body 23 is floating (not connected to the circuit). Although not shown, the body 23 may also be biased, either with a D.C. or with an A.C. signal to provide an auxiliary signal input to the device. Also, if the body 23 is thin and relatively resistive, an auxiliary gate electrode (not shown) may be positioned adjacent the body 23 opposite the gate 33 to provide an auxiliary signal input.

FIGURES 4 and 5 illustrate a second embodiment 61 of the invention similar to the first embodiment except that the insulator 29 is wedge-shaped or tapered, instead of stepped, to provide a continuous change in thickness from one side of the channel to the other, that is, transverse to the direction of drain current flow. This structure may be considered to have an infinite number of steps, which control an infinite number (a continuous spectrum) of drain current paths which grade smoothly over a finite range of pinch-off voltages.

FIGURES 6 and 7 illustrate a third embodiment 63 which is similar to the first embodiment illustrated in FIGURE 1 except that the insulator 29 is replaced with an insulator 65 of uniform thickness and which is comprised of three different laterally-positioned regions 65*a*, 65*b*, and 65*c*, having different dielectric constants, that is, the dielectric constant of the composite insulator 65 is stepped in a direction transverse to the direction of drain current flow in the channel 31. The insulator 65*a* over one side of the channel 31 (the left side as viewed in FIGURE 7) has the lowest dielectric constant, the other side of the channel 31 from source 25 to drain 27 (the right side as viewed in FIGURE 7) has the highest dielectric constant, and the insulator over central portion of the channel from source to drain 65*b* has an intermediate dielectric constant. When a gate voltage is applied to the gate electrode 37, the portion of the transistor having the insulator portion 65*c* of highest dielectric constant will pinch off first, and the portion 65*a* having the insulator of lowest dielectric constant will pinch off last. The difference in dielectric constants in the insulator 65 may be obtained by depositing different insulator materials, as by successive depositions, upon the channel 31.

FIGURE 8 illustrates a fourth embodiment which is similar to the third embodiment illustrated in FIGURE 6 except that the dielectric constant of the insulator is tapered in a direction transverse to the direction of drain current flow, instead of being stepped. In this embodiment, the dielectric constant of the insulator 65 changes continuously from one side of the channel 31 to the other providing a continuously changing pinch off voltage across the channel over a finite voltage range.

FIGURES 9 and 10 illustrate the fifth embodiment which is similar to the first embodiment of FIGURE 1 except that the insulator 29 has a uniform thickness and dielectric constant, and the channel 31 is comprised of three different regions 31*a*, 31*b*, 31*c*, having different dielectric constants. The dielectric constant of the channel therefore is stepped in the sense that the dielectric constant transverse to the direction of drain current flow changes discontinuously by discrete amounts for each of the channel portions. One side of the channel 31*a* (the left side as viewed in FIGURE 10) has the lowest dielectric constant, the other side of the channel 31*c* (the right side as viewed in FIGURE 9) has the highest dielectric constant, and the central portion 31*b* has an intermediate dielectric constant. When an increasing gate voltage is applied to the gate electrode 33, the portion of the transistor having the channel 31*c* with the highest dielectric constant pinches off first, and the portion having the channel 31*a* of lowest dielectric constant, pinches off last. The difference in dielectric constants in the channel 31 may be provided by using different semiconductor materials, for example, deposited epitaxially in successive steps upon a common semiconductor support.

FIGURE 11 illustrates a sixth embodiment which is similar to the fifth embodiment illustrated in FIGURE 9, except that the dielectric constant of the channel 29 is tapered instead of being stepped in a direction transverse to the direction of drain current flow. In this embodiment, the dielectric constant of the channel changes continuously from one side of the channel to the other providing a continuous change in pinch-off voltage across the channel 31 over a finite voltage range. The variable dielectric constant insulator may be provided as hereinafter described.

FIGURE 12 illustrates a seventh embodiment which is similar to the fifth embodiment illustrated in FIGURE 9 except that the conductivity, instead of the dielectric constant of the channel 31 is either stepped or tapered from side to side laterally across the channel, that is, the conductivity of the channel varies either in a step-wise or in a continuous manner. The higher the conductivity of the channel, the higher the transconductance at $V_G=0$. The conductivity in the channel may be modified by changing the impurity concentration laterally across the channel in a manner known in the art. One method applicable to thin film evaporated transistors is to use a mask protecting part of the channel during a gas discharge step, which is known to increase the conductivity of the unmasked portion of the channel. Another method applicable to silicon transistors is to cover the entire channel with doped oxide deposited from silane, and then to remove it over part of the channel, then to cover the entire channel with another doped oxide of different doping concentration, and then to heat the structure to diffuse impurities from the doped oxide into the channel.

Finally, combinations of the foregoing techniques may be used to provide other embodiments of the invention. FIGURE 13 illustrates an eighth embodiment of the invention which comprises a structure similar to that of the first embodiment illustrated in FIGURE 1 except that the insulator 29 has two steps in thickness, each step further comprising two portions having different dielectric constants and the channel comprising four portions having different conductivities, which channel portions are offset physically from the portions of different dielectric constant in the insulator. Such a structure comprises effectively eight current paths having different pinch-off voltages.

The devices of the invention include structures having channels constituted of a single crystal such as silicon produced directly in a single crystal body or produced epitaxially on a single crystal body. For such single crystal structures, the insulator may be deposited as from a vapor phase, or, in some materials such as silicon, may be grown in situ as by thermal oxidation. The embodiments of the invention include also structures having a channel of polycrystalline material, such as cadmium sulfide, cadmium selenide, or tellurium, preferably produced by deposition from a vapor. For such polycrystalline structures, the insulator is preferably produced by deposition from a vapor. Also, in devices with polycrystalline channels, the channel material may be deposited upon the insulator or the insulator may be deposited upon the channel.

The fabrication techniques for insulated-gate field effect transistors are similar to those used to produce planar bipolar transistors and integrated monolithic deivces. Impurity diffusion techniques may be used, and geometry may be controlled by precision masking and photolithographic techniques.

A fabrication schedule for a stepped oxide remote cutoff channel device may be as follows: A lightly doped P-type silicon wafer, about one inch in diameter and 0.007 inch thick, is polished on one side and the surface heavily oxidized in a furnace at about 900° C. containing a steam atmosphere to produce an oxide surface coating. The oxide surface coating that is formed is then etched away in selected areas defined by masking, using graphic techniques. Next, the wafer is heated at about 1050° C. for 10 minutes in an atmosphere containing an N-type dopant, such as phosphorus, thereby forming source and drain regions which are not covered by the oxide. The entire remaining oxide layer is then removed. Then, the wafer is heated at about 900° C. in wet oxygen gas for about five hours until another, second oxide layer about 4000 A. thick is formed on the surface of the wafer. The wafer is cooled to room temperature and then reheated at about 400° C. in dry hydrogen gas for about 5 minutes to produce a desired channel characteristic. The second oxide layer is selectively removed over the source and drain regions as by etching. The oxide layer over the channel is now stepped by using a series of photolithographic and partial etching operations designed to reduce the oxide thickness. The number of these operations depends upon the requisite number of oxide steps. In this example, four steps are produced having thicknesses of about 1000, 2000, 3000 and 4000 A. Metal is evaporated over the entire wafer, and then selectively etched from all areas of the wafer except over the source region, the drain region and the stepped oxide. The metal over the stepped oxide between the source region and the drain region constitutes the gate of the device. The wafer is then diced into separate units or arrays. The units or arrays are mounted on a suitable support and leads are bonded thereto, as by thermal compression. After bonding, the units are encapsulated.

Another method for obtaining the stepped oxide employs photolithographic techniques to partially, instead of fully, remove the oxide. The oxide growth is then reheated. The areas with oxide already present grow thicker and the stripped regions grow to a thinner layer.

A method for obtaining a continuously tapered oxide is to selectively deposit the insulator as by vapor deposition. By this technique, an aperture mask is moved slowly during the deposition laterally along the channel. The tapering of the oxide is controlled by the movement of the aperture mask and the rate of deposition. The thickness may be profiled by adjusting the rate of movement of the mask.

The fabrication of gate structures with a tapered or stepped dielectric constant in the insulator may be done by vapor deposition using more than one source, depositing different materials in sequence through a repositioned mask. One may, for example, use three sources with three different insulators with three different dielectric constants corresponding to 65*a* 65*b*, and 65*c* in FIGURE 7. After depositing the insulator corresponding to 65*a* through a suitable mask, the mask is moved laterally to the position corresponding to 65*b* and the insulator corresponding to 65*b* is deposited. By repeating the procedure the third insulator corresponding to 65*c* is laid down. By gradually moving the mask while gradually shifting from one insulator to the other, an insulator layer with tapered dielectric constant can be obtained.

For fabrication of structures with a tapered or stepped dielectric constant in the semiconductor, the same procedure may be used with three sources of three different semiconductors in combination with a movable mask.

What is claimed is:

1. An insulated-gate field-effect transistor comprising a source and a drain defining the ends of a current carrying channel of controllable conductivity, a gate spaced from said channel by an insulator, said insulator including means for providing a remote cutoff gain characteristic for said transistor.

2. An insulated-gate field-effect transistor comprising a source and a drain defining the ends of a plurality of current paths of controllable conductivity, and a gate spaced from said current paths by an insulator, said insulator including means for providing differing pinch-off voltages laterally along said gate for said current paths.

3. An insulated-gate field-effect transistor comprising a channel of a semiconductor material, a source and a drain connected to said channel and defining the ends of a plurality of current paths in said channel, and a metallic gate across and spaced from said channel by an insulator, said insulator including means providing differing predetermined pinch-off voltages for said current paths laterally along said gate.

4. An insulated-gate field-effect transistor comprising a channel, a source and a drain connected to said channel and defining the ends of a plurality of current paths in said channel, and a gate across and spaced from said channel by an insulator, said insulator varying continuously as to some physical characteristic in a direction transverse to said current paths and along said gate.

5. An insulated-gate field-effect transistor comprising a channel, a source and a drain connected to said channel and defining the ends of a plurality current paths in said channel, and a gate across and spaced from said channel by an insulator, said insulator varying discontinuously as to some physical characteristic in a direction transverse to said current paths and along said gate.

6. An insulated-gate field-effect transistor comprising a channel, a source and a drain connected to said channel and defining the ends of a plurality of current paths in said said channel, and a gate across and spaced from said channel by an insulator, the thickness of said insulator varying continuously in a direction transverse to said current paths and along said gate.

7. An insulated-gate field-effect transistor comprising a channel, a source and a drain connected to said channel and defining the ends of a plurality of current paths in said channel, and a gate across and spaced from said channel by an insulator, the thickness of said insulator varying discontinuously in a direction transverse to said current paths and along said gate.

8. An insulated-gate field-effect transistor comprising a semiconductor body having a channel adjacent a surface thereof, a source and a drain connected to said channel defining the ends of a plurality of current paths in said channel, and a metallic gate spaced from said channel by a thin insulator layer, the thickness of said insulator varying in a direction transverse to said current paths and substantially parallel to said surface, said transistor having differing predetermined pinch-off voltages laterally across said channel.

9. An insulated-gate field-effect transistor comprising a semiconductor body having a channel therein adjacent a surface thereof, a source and a drain connected to said channel defining the ends of a plurality of current paths in said channel, and a metallic gate across and spaced from said channel by a thin insulator layer, said insulator having at least two different thicknesses in a direction transverse to said current paths and substantially parallel to said surface, said transistor having differing predetermined pinch-off voltages laterally across said channel.

10. A circuit including an insulated-gate field-effect transistor comprising a source and a drain defining the ends of a plurality of current paths of controllable conductivity, and a gate spaced from said current paths by an insulator, said insulator including means for providing differing pinch-off voltages laterally along said gate, a source of input voltage, means for applying said input voltage to said gate, and means for deriving an output voltage across said source and drain.

11. A circuit including an insulated-gate field-effect transistor comprising a source and a drain defining the ends of a plurality of current paths of controllable conductivity, and a gate spaced from said current paths by an insulator, said insulator including means for providing differing pinch-off voltages laterally along said gate, at least two sources of input voltages, means for applying voltages from both of said sources to said gate, and means for deriving an output voltage across said source and drain.

References Cited

UNITED STATES PATENTS

| | | | |
|---|---|---|---|
| 2,951,191 | 8/1960 | Herzog | 317—235 |
| 3,102,230 | 8/1963 | Dawon Kahng | 323—94 |
| 3,229,218 | 1/1966 | Sickles, et al. | 330—29 |
| 3,260,948 | 7/1966 | Theriault | 330—18 |
| 3,307,110 | 2/1967 | Harwood | 325—451 |

JOHN W. HUCKERT, *Primary Examiner.*

R. F. SANDLER, *Assistant Examiner.*